(12) United States Patent
Sato et al.

(10) Patent No.: US 7,554,092 B2
(45) Date of Patent: Jun. 30, 2009

(54) X-RAY DETECTOR

(75) Inventors: Kenji Sato, Shiga-ken (JP); Toshiyuki Sato, Kyoto (JP); Takayuki Nakayama, Yamanashi-ken (JP); Yoichiro Shimura, Yamanashi-ken (JP); Kazuhiko Shima, Yamanashi-ken (JP)

(73) Assignees: Shimadzu Corporation, Kyoto (JP); Shindengen Electric Manufacturing Co., Ltd., Tokyo (JP); Shindengen Sensor Device Co., Ltd., Yamanashi-Ken (JP)

(*) Notice: Subject to any disclaimer, the term of this patent is extended or adjusted under 35 U.S.C. 154(b) by 1048 days.

(21) Appl. No.: 10/417,149

(22) Filed: Apr. 17, 2003

(65) Prior Publication Data

US 2003/0223534 A1  Dec. 4, 2003

(30) Foreign Application Priority Data

Apr. 23, 2002  (JP) .............................. 2002-120678

(51) Int. Cl.
*G21K 1/12* (2006.01)
(52) U.S. Cl. .............................. 250/370.12; 250/370.09; 250/370.13
(58) Field of Classification Search ............ 250/370.12, 250/370.09, 370.13
See application file for complete search history.

(56) References Cited

U.S. PATENT DOCUMENTS

| | | | | |
|---|---|---|---|---|
| 5,396,072 A | * | 3/1995 | Schiebel et al. | 250/370.09 |
| 5,729,021 A | * | 3/1998 | Brauers et al. | 250/370.09 |
| 6,171,643 B1 | * | 1/2001 | Polischuk et al. | 427/76 |
| 2001/0025933 A1 | * | 10/2001 | Imai | 250/580 |
| 2005/0061987 A1 | * | 3/2005 | Watadani et al. | 250/370.08 |

FOREIGN PATENT DOCUMENTS

| EP | 0 826 983 A1 | 3/1998 |
|---|---|---|
| EP | 1009038 A2 * | 6/2000 |
| EP | 1 249 871 A2 | 10/2002 |

OTHER PUBLICATIONS

European Search Report for co-pending application mailed on Oct. 16, 2003.

* cited by examiner

*Primary Examiner*—David P Porta
*Assistant Examiner*—Shun Lee
(74) *Attorney, Agent, or Firm*—Cheng Law Group PLLC

(57) ABSTRACT

An X-ray detector for detecting X rays includes a semiconductor for generating electric charges therein upon X-ray incidence, and electrodes formed on opposite sides of the semiconductor for application of a predetermined bias voltage. The semiconductor is amorphous selenium (a-Se) doped with a predetermined quantity of an alkali metal.

9 Claims, 6 Drawing Sheets

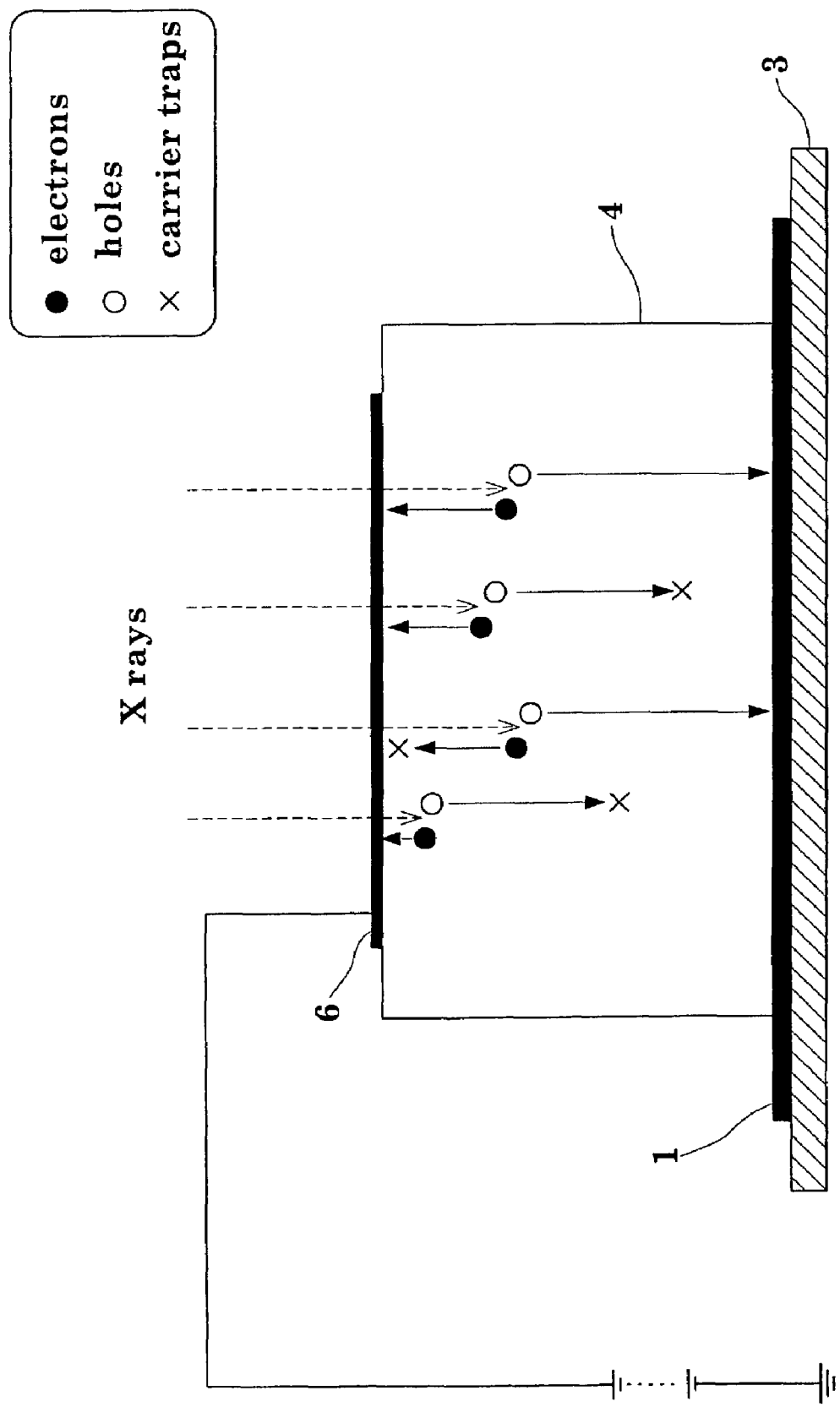

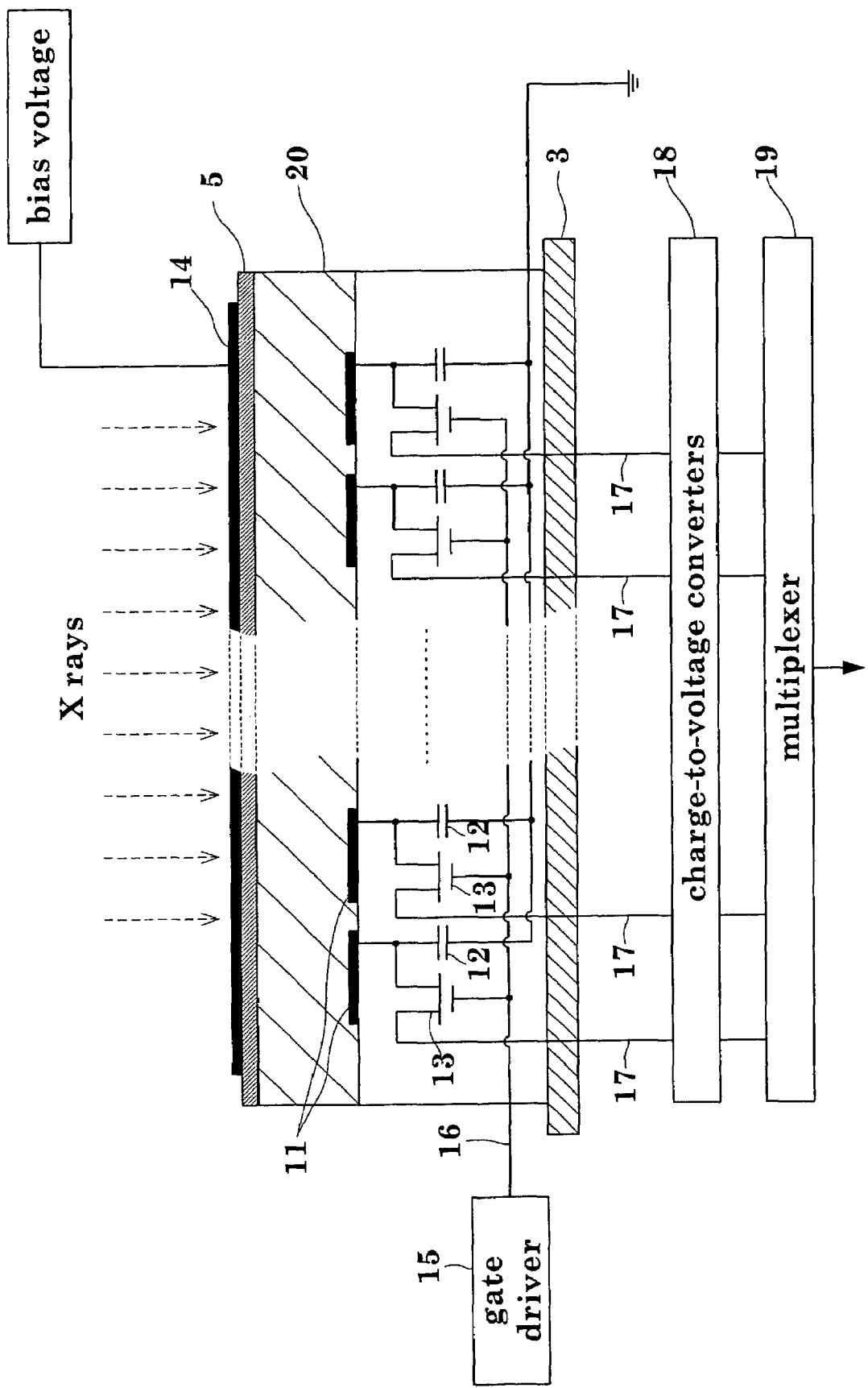

Fig.5

|  | Na concentration [ppm] | signal current deterioration ΔI with positive bias [nA/cm$^2$] | signal current deterioration ΔI with negative bias [nA/cm$^2$] |
|---|---|---|---|
| testing 1 | 0.01 | 2.7 | 4.5 |
| testing 2 | 0.1 | 1.4 | 3.1 |
| testing 3 | 0.5 | 0.5 | 2.1 |
| testing 4 | 1.0 | 0.9 | 2.8 |
| testing 5 | 5.0 | 1.8 | 3.3 |
| testing 6 | 10.0 | 2.2 | 3.7 |
| comparison 1 | 20.0 | 8.9 | 6.4 |
| comparison 2 | 0.00 | 13.8 | 12.0 |

Fig.7

|  | K concetration [ppm] | signal current deterioration ΔI with positive bias [nA/cm$^2$] | signal current deterioration ΔI with negative bias [nA/cm$^2$] |
|---|---|---|---|
| testing 7 | 0.5 | 0.3 | 1.9 |

Fig.8

|  | Li concetration [ppm] | signal current deterioration ΔI with positive bias [nA/cm$^2$] | signal current deterioration ΔI with negative bias [nA/cm$^2$] |
|---|---|---|---|
| testing 8 | 0.1 | 1.2 | 3.5 |

X-RAY DETECTOR

BACKGROUND OF THE INVENTION (1) Field of the Invention

This invention relates to an X-ray detector for measuring X rays in the medical, industrial, nuclear and other fields.

(2) Description of the Related Art

In an X-ray detector having electrodes formed at opposite sides of a semiconductor, a predetermined bias voltage is applied between the electrodes, and electric charges generated in the semiconductor by incident X rays are detected as electric signals. For such an X-ray detector, various semiconductor materials are selectively used according to purpose. These semiconductor materials are manufactured in various ways. Generally, for an X-ray detector required to have energy resolution, a high-purity single crystal semiconductor such as silicon (Si) tends to be used.

An X-ray detector using amorphous selenium (a-Se) in particular can easily realize a high resistance thick film sized 1,000 cm$^2$ or larger by using a film coating technique such as vacuum deposition method. This X-ray detector is ideal for use in a field requiring a large area for X-ray measurement.

However, an amorphous selenium (a-Se) film formed by such a method includes many structural defects. Generally, therefore, an appropriate quantity of impurity is added (i.e. doped) in order to improve performance.

The conventional detector constructed as described above has the following drawback.

Unlike a single crystal semiconductor, the conventional detector has many potential structural defects. These defects trap charge transfer media (carriers) of electrons and holes generated in the semiconductor layer by X-ray incidence. The trapped carriers cannot be picked up as electric signals. This causes a phenomenon of deterioration in the sensitivity of the X-ray detector.

This phenomenon will particularly be described hereinafter with reference to FIGS. 2A and 2B. FIGS. 2A and 2B are explanatory views of an internal structure of the X-ray detector. The structural defects in amorphous selenium (a-Se), as shown in FIG. 2B, include recombination centers $D^0$ and ionized recombination centers $D^+$ (electron trapping centers) and $D^-$ (hole trapping centers) present in a fixed ratio. A density of $D^+$ and $D^-$ at this time determines an initial value of sensitivity of the X-ray detector. This state is expressed by the following formula:

$$2D^0 \rightarrow D^+ + D^-$$

When X rays impinge in this state to generate charge transfer media (carriers) of electrons (e−) or holes (h+) in amorphous selenium (a-Se), these media are first trapped by the recombination centers $D^0$ to change into $D^-$ and $D^+$, respectively. In this way, the density of $D^+$ and $D^-$ increases to deteriorate sensitivity. This relationship is expressed by the following two formulas:

$$D^0 + e^- \rightarrow D^-$$

$$D^0 + h^+ \rightarrow D^+$$

SUMMARY OF THE INVENTION

The object of this invention is to provide an X-ray detector which compensates for structure defects in amorphous selenium (a-Se) to be free from sensitivity deterioration.

The above object is fulfilled, according to this invention, by an X-ray detector for detecting X rays comprising a semiconductor for generating electric charges therein upon X-ray incidence, and electrodes formed on opposite sides of the semiconductor for application of a predetermined bias voltage, wherein the semiconductor is amorphous selenium (a-Se) doped with a predetermined quantity of an alkali metal.

As shown in FIG. 2A, an alkali metal M having a strong ionization tendency is added (doped) to amorphous selenium (a-Se) which is a semiconductor layer sensitive to X rays, in a quantity to compensate for the structural defects $D^0$. Thus, the structural defects in amorphous selenium (a-Se) are only $D^0$ which are recombination centers and $D^-$ (hole trapping centers) which are negatively ionized $D^0$. This state is expressed by the following formula (1):

$$2D^0 + M \rightarrow M^+ + D^- + D^0 \qquad (1)$$

When, in this state, incident X rays generate charge transfer media (carriers) of electrons (e−) and holes (h+) in amorphous selenium (a-Se), the electrons are captured by the recombination centers $D^0$ to change into $D^-$, and the holes captured by $D^-$ to change into $D^0$.

This relationship is expressed by the following two formulas (2) and (3):

$$D^0 + e^- \rightarrow D^- \qquad (2)$$

$$D^- + h^+ \rightarrow D^0 \qquad (3)$$

As seen from these formulas (2) and (3), where the electron capturing probability and the hole capturing probability are exactly equal, the density of $D^-$ never increases, and hence no sensitivity deterioration. Even where the electron capturing probability is higher than the hole capturing probability to increase the density of $D^-$, only the holes are captured in an increased quantity. Since no increase takes place in the quantity of electrons captured, sensitivity deterioration is suppressed to a half.

In the X-ray detector having the above construction according to this invention, preferably, one of the electrodes formed at an X-ray incidence side is a positive electrode to which the bias voltage is applied to increase potential.

Since the electrode at the X-ray incidence side is a positive electrode to which the bias voltage is applied to increase potential, as shown in FIG. 3, electrons generated by X-ray incidence move toward the X-ray incidence side while holes move to the opposite side. The interaction between X rays and a material is characterized by the stronger reaction tending to occur in the regions closer to the surface of the material. Thus, many of the electrons are generated by X-ray incidence near a plane of X-ray incidence. These electrons move toward the electrode at the side of X-ray incidence, and thus move reduced distances.

Thus, the probability of the electrons reaching the electrode without being captured by the recombination centers $D^0$ is increased to minimize an increase of $D^-$. In this way, not only an increase in the quantity of electrons captured is suppressed, but also an increase in the quantity of holes captured is suppressed. Consequently, hardly any sensitivity deterioration occurs with the X-ray detector.

In the X-ray detector according to this invention, the quantity of the alkali metal doped, preferably, is in a range of 0.01 to 10 ppm, and more preferably in a range of 0.05 to 2 ppm.

Where the quantity of the alkali metal added (doped) is in a range of 0.01 to 10 ppm, which substantially corresponds to a quantity compensating for the structural defects $D^0$ of amorphous selenium (a-Se), the reaction in formula (1) takes place reliably to suppress sensitivity deterioration.

Where the quantity of the alkali metal added were less than 0.01 ppm, the effect of the alkali metal would diminish to result in a sensitivity deterioration. Where the quantity of the alkali metal added were larger than 0.01 ppm, the alkali metal would be deposited alone, resulting in an increase in dark current and a rapid fall of sensitivity.

Naturally, even in the above range, an optimum value exists according to the type of alkali metal and film forming conditions such as vapor deposition temperature and substrate temperature. In the case of Na, for example, an optimal quantity is the range of 0.05 to 2 ppm.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 3 is an explanatory view showing functions of the X-ray detector according to this invention;

FIG. 4 is a schematic sectional view showing the construction of a modified X-ray detector according to this invention;

FIG. 5 shows features of samples and measurement data;

FIG. 7 shows features of a sample and measurement data; and

FIG. 8 shows features of a sample and measurement data.

DESCRIPTION OF THE PREFERRED EMBODIMENTS

A preferred embodiment of this invention will be described in detail hereinafter with reference to the drawings.

Figure 1:
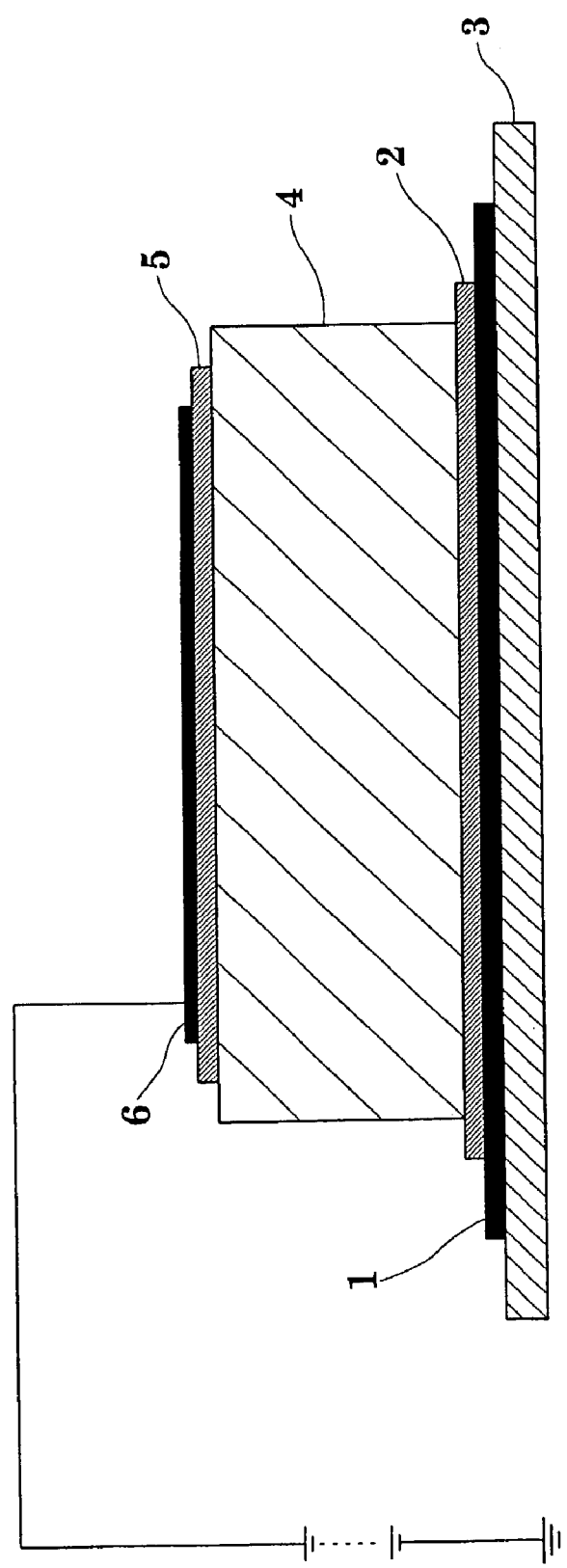
FIG. 1 is a schematic sectional view showing the construction of an X-ray detector according to this invention.

FIGS. 1 through 4 show one embodiment of the invention. FIG. 1 is a schematic sectional view showing the construction of an X-ray detector. FIGS. 2A and 2B are explanatory views showing an internal structure of the X-ray detector. FIG. 3 is an explanatory view showing functions of the X-ray detector according to this invention. FIG. 4 is a schematic sectional view showing the construction of a modified X-ray detector.

As shown in FIG. 1, the X-ray detector in this embodiment includes a carrier collection electrode 1 and a lower carrier selection layer 2 formed on an insulating substrate 3 such as a glass substrate. A semiconductor thick film 4 of amorphous selenium (a-Se) is formed also on the substrate 3. An alkali metal has been added (doped) to the amorphous selenium in a range of 0.01 to 10 ppm, preferably in a range of 0.05 to 2 ppm. A voltage application electrode 6 is formed on the semiconductor thick film 4 through an upper carrier selection layer 5.

The lower and upper carrier selection layers 2 and 5 are provided for suppressing dark current by using the notable difference in contribution to charge transfer action between electrons and holes acting as carriers in the semiconductor. Where a positive bias is applied to the voltage application electrode 6, an n-type semiconductor layer such as CdSe, CdS or $CeO_2$, a semi-insulator layer such as $Sb_2S_3$ or an amorphous Se layer doped with As or Te is used as the upper carrier selection layer 5 in order to restrict an injection of holes. As the lower carrier selection layer 2, a p-type semiconductor layer such as ZnSe, ZnTe or ZnS, a semi-insulator layer such as $Sb_2S_3$ or an amorphous Se layer doped with a halogen such as Cl is used in order to restrict an injection of electrons. A semi-insulator layer such as $Sb_2S_3$ can reverse the contributions of electrons and holes based on film forming conditions.

The X-ray detector in this embodiment applies a bias voltage to the voltage application electrode 6, with an X-ray incidence generating electric charges (electrons and holes) in the amorphous selenium (a-Se) semiconductor thick film 4. The X-ray detector detects, as electric signals from the carrier collection electrode 1, electric charges induced by movement of the generated electrons and holes toward the two electrodes, respectively.

Figures 2A, 2B:
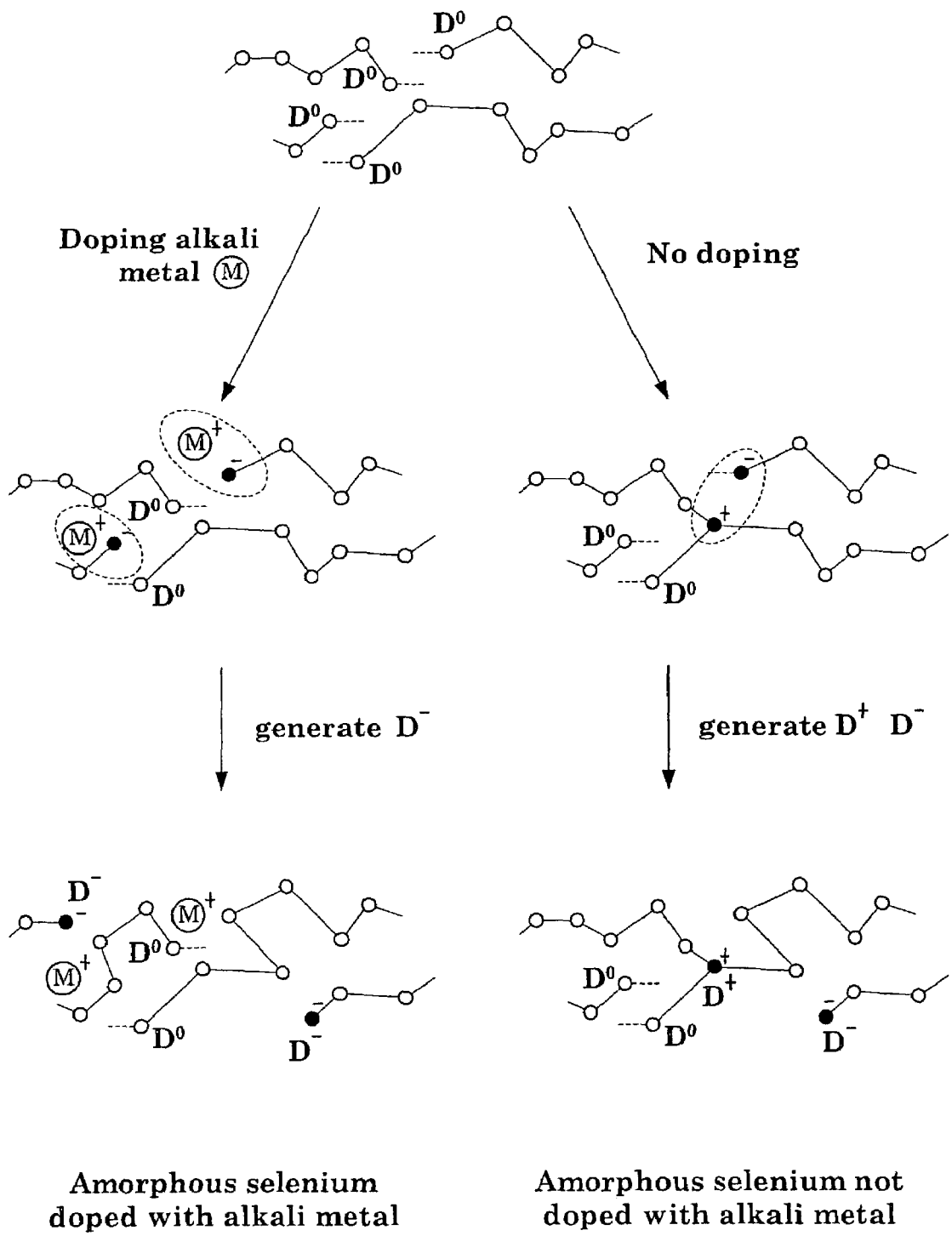
FIGS. 2A and 2B are explanatory views showing an internal structure of the X-ray detector according to this invention.

As shown in FIG. 2B, the amorphous selenium (a-Se) semiconductor thick film 4 has, present therein, three types of structural defects, i.e. recombination centers $D^0$ and ionized recombination centers $D^+$ (electron trapping centers) and $D^-$ (hole trapping centers). In the case of the X-ray detector in this embodiment, however, alkali metal M is added (doped) to the amorphous selenium (a-Se) semiconductor thick film 4. As shown in FIG. 2A, only $D^0$ and $D^-$ are present. The value of sensitivity is determined by a density of $D^+$ and $D^-$. $D^-$ increases by X-ray irradiation according to formula (2) set out hereinbefore, but no increase in $D^+$ takes place. Thus, deterioration in the sensitivity of the X-ray detector is suppressed to a half.

Further, when a positive bias voltage is applied so that the electrode at the X-ray incidence side, i.e. the voltage application electrode 6, has a higher potential than the carrier collection electrode 1, as shown in FIG. 3, electrons generated by X-ray incidence move toward the X-ray incidence side while holes move to the opposite side. The interaction between X rays and a material is characterized by the stronger reaction tending to occur in the regions closer to the surface of the material. Thus, many of the electrons are generated by X-ray incidence near a plane of X-ray incidence. These electrons move toward the electrode at the side of X-ray incidence. Consequently, the electrons move reduced distances. This increases the probability of the electrons reaching the voltage application electrode 6 without being captured by the recombination centers $D^0$, thereby minimizing an increase of $D^-$. As a result, hardly any sensitivity deterioration occurs with the X-ray detector.

FIG. 4 shows a schematic sectional view of a modified embodiment in which the above X-ray detector is developed to form a plurality of channels in a two-dimensional matrix. Each carrier collection electrode 11 is connected to a capacitor 12 for charge storage and a switching device 13 (thin film transistor (TFT) switch) for reading the charges. The carrier collection electrodes 11 are arranged on a TFT substrate having the capacitors 12 and switching devices 13 to constitute a two-dimensional array. Like reference numerals are used to identify like elements of the X-ray detector described hereinbefore, and will not be described again.

When the X-ray detector in this modification is irradiated with X rays, with a bias voltage applied to a voltage application electrode 14 formed over an entire surface as a common electrode, electric charges (electrons and holes) generated move toward the opposite electrodes, respectively. The induced charges are stored in the charge storing capacitors 12 connected through the carrier collection electrodes 11 to locations of X-ray incidence. In time of reading, an ON signal is sent in from a gate driver 15 through gate lines 16 to turn on (connect) the switching devices 13. Then, the stored charges are transmitted as radiation detection signals through sense lines 17 to pass through charge-to-voltage converters 18 and a multiplexer 19 to be outputted as digital signals to provide a two-dimensional X-ray image.

With such a two-dimensional array construction, the characteristic of the X-ray detector according to this invention appears conspicuously.

Specifically, with a conventional X-ray detector, a sensitivity deterioration takes place according to the incidence intensity of X rays, to cause local sensitivity variations. Its influence is conspicuous on the quality of images photographed subsequently. In the X-ray detector in this modified embodiment, on the other hand, an alkali metal is added (doped) to an amorphous selenium (a-Se) semiconductor thick film 20, and a positive bias is applied to the voltage application electrode 14 in use. Thus, hardly any sensitivity deterioration takes place, to be free from image quality deterioration such as sensitivity variations.

In the foregoing X-ray detector and its modification, typical examples of the alkali metal are Li, Na and K. As described in relation to the functions of this invention, similar effects may be produced by doping an alkali earth metal such as Ca or a nonmetallic element such as H as long as such an element has a strong ionization tendency and a reducing effect.

<Measurement Data of this Invention and Comparison with the Prior Art>

Next, verification is made that sensitivity deterioration is improved by the X-ray detector in this embodiment.

As shown in FIG. 5, samples used here include eight X-ray detectors, i.e. X-ray detectors for testing 1-6 and X-ray detectors for comparison 1 and 2. The detectors for testing 1-6 have alkali metal Na added (doped) to the amorphous selenium (a-Se) semiconductor thick film 20 in 0.01 ppm, 0.1 ppm, 0.5 ppm, 1.0 ppm, 5.0 ppm and 10.0 ppm, respectively. The X-ray detector for comparison 1 has alkali metal Na added (doped) in 20.0 ppm to the amorphous selenium (a-Se) semiconductor thick film 20. The X-ray detector for comparison 2 has an amorphous selenium (a-Se) semiconductor thick film with no doping. The amorphous selenium (a-Se) semiconductor thick film 4 is 1 mm thick in all of the X-ray detectors.

Figure 6:
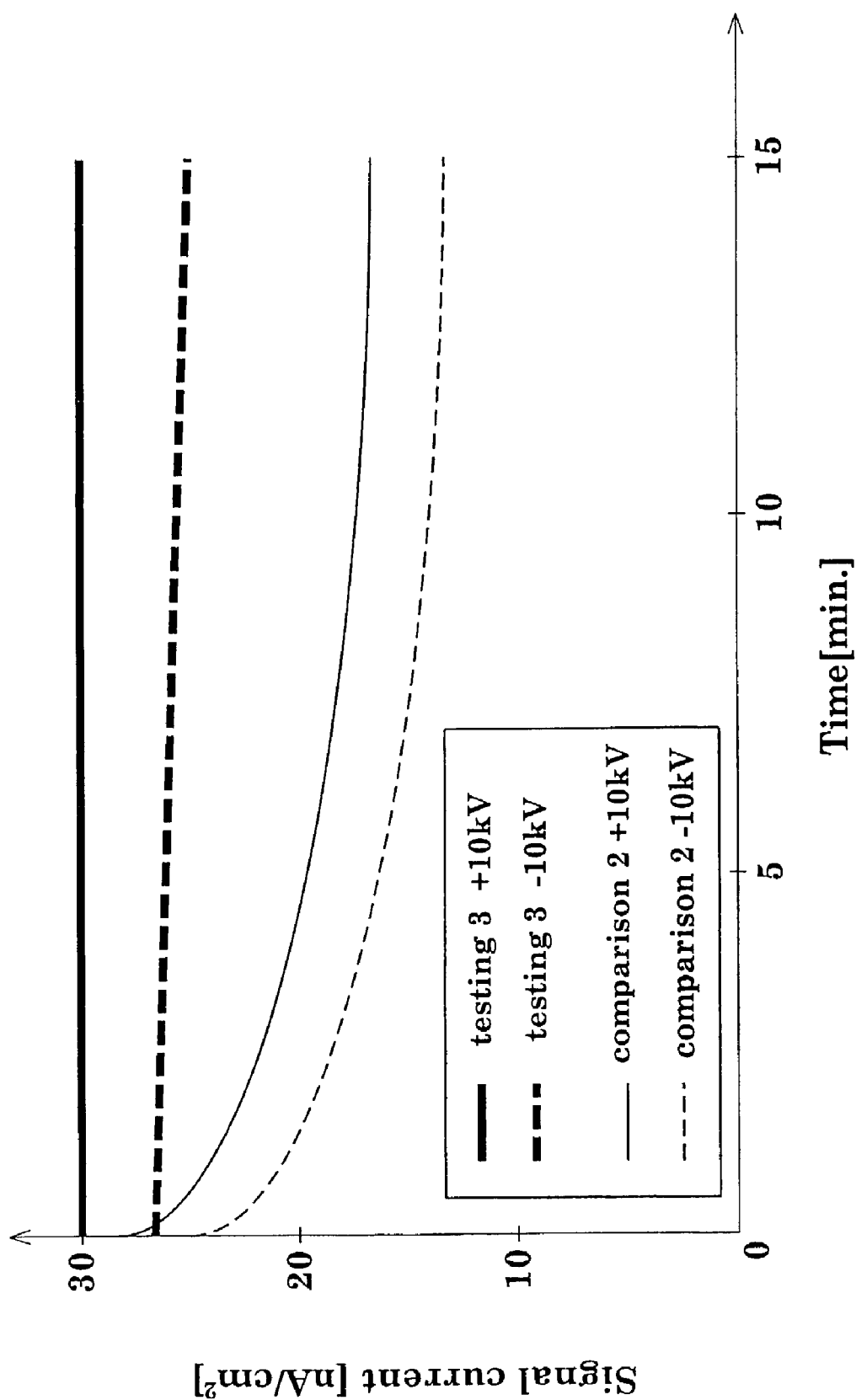
FIG. 6 is graph showing variations in signal currents of two X-ray detectors for testing 3 and comparison 2.

For all the X-ray detectors for testing and for comparison, ±10 kV bias voltages were applied to the voltage application electrode 6, and an ammeter was connected to the carrier collection electrode 1 to read signal currents. In this state, the X-ray detectors were irradiated continuously for 15 minutes with X rays passed through a 1 mm aluminum filter under the conditions of 80 kV tube voltage and 2.2 mA tube current, and variations in the signal current were recorded. FIG. 6 shows the variations in the signal current obtained.

As seen, the X-ray detector for comparison 2 has signal currents falling exponentially with both the positive and negative bias voltages. The X-ray detector for testing 3 has a signal current hardly changing with the positive bias, and a signal current falling only slightly with the negative bias. Amount of signal current deterioration ΔI in FIG. 5 represents a difference between a signal current immediately following the X-ray irradiation and a signal current 15 minutes thereafter, i.e. an amount of sensitivity deterioration.

The above results show that amount of signal current deterioration ΔI is small and little sensitivity deterioration occurs with alkali metal Na doped in the range of 0.01 to 10.0 ppm. It will also be understood that sensitivity deterioration is less with the positive bias than with the negative bias.

Similarly, an X-ray detector for testing 7 was fabricated by doping 0.5 ppm of potassium (K), and variations in the signal current were checked. The results are shown in FIG. 7. It will be seen that amount of signal current deterioration ΔI is clearly smaller than for the detector for comparison 2 not doped with potassium (K).

Further, an X-ray detector for testing 8 was fabricated by doping 0.1 ppm of lithium (Li), and variations in the signal current were checked. The results are shown in FIG. 8. It will be seen that amount of signal current deterioration ΔI is clearly smaller than for the detector for comparison 2 not doped with lithium (Li).

These results prove that similar effects are produced by doping alkali metals other than sodium (Na), to suppress sensitivity deterioration.

This invention may be embodied in other specific forms without departing from the spirit or essential attributes thereof and, accordingly, reference should be made to the appended claims, rather than to the foregoing specification, as indicating the scope of the invention.

What is claimed is:

1. An X-ray detector for detecting X rays, comprising:
   a semiconductor for generating electric charges therein upon X-ray incidence;
   electrodes formed on opposite sides of said semiconductor for application of a predetermined bias voltage;
   a first carrier selection layer formed on said semiconductor at a side of a positive one of said electrodes, that is at a side of an electrode having a higher potential, for restricting an injection of holes; and
   a second carrier selection layer formed on said semiconductor at a side of a negative one of said electrodes, that is at a side of an electrode having a lower potential, for restricting an injection of electrons;
   wherein said semiconductor is amorphous selenium (a-Se) doped with a predetermined quantity of an alkali metal or alkaline earth metal in a quantity ranging from 0.01 to 10 ppm.

2. An X-ray detector as defined in claim 1, wherein one of said electrodes formed at an X-ray incidence side is a positive one of said electrodes to which the bias voltage is applied to increase potential.

3. An X-ray detector as defined in claim 2, wherein the quantity of the alkali metal or alkaline earth metal doped is in a range of 0.05 to 2 ppm.

4. An X-ray detector as defined in claim 2, wherein said alkali metal or alkaline earth metal is one of Li, Na, K, and Ca.

5. An X-ray detector as defined in claim 2, wherein said semi-conductor is formed on a TFT substrate having thin film transistor switches, charge storing capacitors and one of said electrodes.

6. An X-ray detector as defined in claim 1, wherein the quantity of the alkali metal or alkaline earth metal doped is in a range of 0.05 to 2 ppm.

7. An X-ray detector as defined in claim 1. wherein said alkali metal or alkaline earth metal is one of Li, Na, K, and Ca.

8. An X-ray detector as defined in claim 1, wherein said semi-conductor is formed on a TFT substrate having thin film transistor switches, charge storing capacitors and one of said electrodes.

9. An X-ray detector for detecting X rays, comprising:
   a semiconductor for generating electric charges therein upon X-ray incidence;
   electrodes formed on opposite sides of said semiconductor for application of a predetermined bias voltage;
   a first carrier selection layer formed on said semiconductor at a side of a positive one of said electrodes, that is at a side of an electrode having a higher potential, for restricting an injection of holes;
   wherein said semiconductor is amorphous selenium (a-Se) doped with a predetermined quantity of an alkali metal or alkaline earth metal in a quantity ranging from 0.01 to 10 ppm.

* * * * *